(12) United States Patent
Chen et al.

(10) Patent No.: US 9,496,251 B2
(45) Date of Patent: Nov. 15, 2016

(54) ELECTROSTATIC DISCHARGE PROTECTOR

(71) Applicant: UNITED MICROELECTRONICS CORPORATION, Hsinchu (TW)

(72) Inventors: Lu-An Chen, Zhubei (TW); Mei-Ling Chao, Hsinchu (TW); Tien-Hao Tang, Hsinchu (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/494,590

(22) Filed: Sep. 24, 2014

(65) Prior Publication Data

US 2016/0086933 A1 Mar. 24, 2016

(51) Int. Cl.
*H01L 23/62* (2006.01)
*H01L 27/02* (2006.01)
*H01L 29/06* (2006.01)

(52) U.S. Cl.
CPC ....... *H01L 27/0248* (2013.01); *H01L 29/0619* (2013.01)

(58) Field of Classification Search
CPC .............. H01L 2924/0002; H01L 2924/00; H01L 29/0692; H01L 27/0277; H01L 27/0266; H01L 29/1087; H01L 23/585; H01L 27/0251; H01L 27/0262; H01L 27/027; H01L 29/0619; H01L 29/0847; H01L 29/78; H01L 29/7835; H01L 23/60; H01L 27/0248

USPC ........ 257/355, 356, 401, 357, 360, E29.255, 257/409, E29.013, E29.136, E29.256, 173, 257/337, 487; 438/197, 199, 202, 289, 514
See application file for complete search history.

(56) References Cited

U.S. PATENT DOCUMENTS

| | | | |
|---|---|---|---|
| 8,490,038 B1 * | 7/2013 | Arora ................... | G06F 17/5081 716/110 |
| 2004/0051146 A1 * | 3/2004 | Ker ....................... | H01L 27/027 257/356 |
| 2007/0187782 A1 * | 8/2007 | Kato ..................... | H01L 29/0619 257/409 |
| 2007/0210387 A1 * | 9/2007 | Russ .................... | H01L 29/0626 257/362 |
| 2010/0200922 A1 * | 8/2010 | Sheu .................... | H01L 27/0259 257/360 |
| 2013/0049112 A1 * | 2/2013 | Lai ....................... | H01L 29/7835 257/337 |

* cited by examiner

*Primary Examiner* — Thao X Le
*Assistant Examiner* — Nduka Ojeh
(74) *Attorney, Agent, or Firm* — Ding Yu Tan

(57) ABSTRACT

The present invention provides electrostatic discharge protectors. One aspect of the present invention provides an electrostatic discharge protector includes a substrate, an electrostatic discharge protection circuit disposed on the substrate, and a pickup ring surrounding the electrostatic discharge protection circuit. The pickup ring has a plurality of low resistance zones where a doping layer, a contact and a metal layer are connected in sequence, and the low resistance zones are distributed within the pickup ring separately and unequally.

7 Claims, 14 Drawing Sheets

ELECTROSTATIC DISCHARGE PROTECTOR

FIELD OF THE INVENTION

The present invention is related to an electrostatic discharge protector especially to an electrostatic discharge protector with a uniformly triggered circuit.

BACKGROUND OF THE INVENTION

Electrostatic discharge (ESD) is a transient process of high energy transformation from external to an integrated circuit (IC) internal when the IC is floated. Several hundred volts, up to several thousand volts are transferred during an ESD event. Such high voltage transformation may cause circuit malfunctions. It becomes important to design an ESD protector that effectively discharges ESD stress.

SUMMARY OF THE INVENTION

In accordance with an aspect, the present invention provides an electrostatic discharge protector includes a substrate, an electrostatic discharge protection circuit disposed on the substrate, and a pickup ring surrounding the electrostatic discharge protection circuit. The pickup ring has a plurality of low resistance zones where a doping layer, a contact and a metal layer are connected in sequence, and the low resistance zones are distributed within the pickup ring separately and unequally.

In one embodiment of the present invention, the pickup ring is a polygonal ring having a first region and an adjacent second region, wherein a first number of the low resistance zones per unit area of the first region is less than a second number of the low resistance zones per unit area of the second region.

In one embodiment of the present invention, the first number is zero.

In one embodiment of the present invention, a first distance between two of adjacent low resistance zones in the first region is larger than a second distance between two of adjacent low resistance zones in the second region.

In one embodiment of the present invention, the pickup ring further has a third region opposite to the first region and a third number of the low resistance zones per unit area of the third region is equal to the first number of the low resistance zones per unit area.

In one embodiment of the present invention, the pickup ring further has a third region opposite to the first region and a third number of the low resistance zones per unit area of the third region is not equal to the first number of the low resistance zones per unit area.

In one embodiment of the present invention, the pickup ring is a non-polygonal ring.

In accordance with another aspect, the present invention provides an electrostatic discharge protector includes a substrate, an electrostatic discharge protection circuit disposed on the substrate, and a pickup ring surrounding the electrostatic discharge protection circuit. The pickup ring has a first region and an adjacent second region and includes a plurality of contacts distributed within the pickup ring separately and unequally.

In one embodiment of the present invention, a first distance between two of adjacent contacts in the first region is larger than a second distance between two of adjacent contacts in the second region.

In one embodiment of the present invention, the pickup ring further has a third region opposite to the first region, wherein a part of the contacts in the first region are aligned with a part of the contacts in the third region.

In one embodiment of the present invention, the pickup ring further has a third region opposite to the first region, wherein a part of the contacts in the first region are asymmetrical with a part of the contacts in the third region.

In one embodiment of the present invention, the pickup ring further has a third region opposite to the first region, and there is no contact disposed in the first region and/or the third region.

In one embodiment of the present invention, the pickup ring further includes a metal layer surrounding the electrostatic discharge protection circuit and covering the contacts.

In one embodiment of the present invention, the pickup ring further includes a doping layer surrounding the electrostatic discharge protection circuit and underlying the contacts.

In accordance with another aspect, the present invention provides an electrostatic discharge protector includes a substrate, an electrostatic discharge protection circuit disposed on the substrate, and a pickup ring surrounding the electrostatic discharge protection circuit. The pickup ring has a first region and an adjacent a second region and includes a plurality of contacts and a doping layer disposed under the contacts, wherein the doping layer has different doping concentrations.

In one embodiment of the present invention, a first distance between two of adjacent contacts in the first region is equal to a second distance between two of adjacent contacts in the second region, and a concentration of a part of the doping layer in the first region is lower than a concentration of a part of the doping layer in the second region.

In one embodiment of the present invention, there is no doping layer disposed within the first region.

In accordance with another aspect, the present invention provides an electrostatic discharge protector includes a substrate, an electrostatic discharge protection circuit disposed on the substrate, a doping layer disposed on the substrate and surrounding the electrostatic discharge protection circuit, a metal layer only disposed over a part of the doping layer, and a plurality of contacts disposed between the doping layer and the metal layer. The doping layer has a first region and a second region.

In one embodiment of the present invention, there is no metal layer disposed over the first region of the doping layer.

In one embodiment of the present invention, the metal layer includes a plurality of metal blocks distributed separately, a first distance between two of adjacent metal blocks over the first portion of the doping layer is larger than a second distance between two of adjacent metal blocks over the second region of the doping layer.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
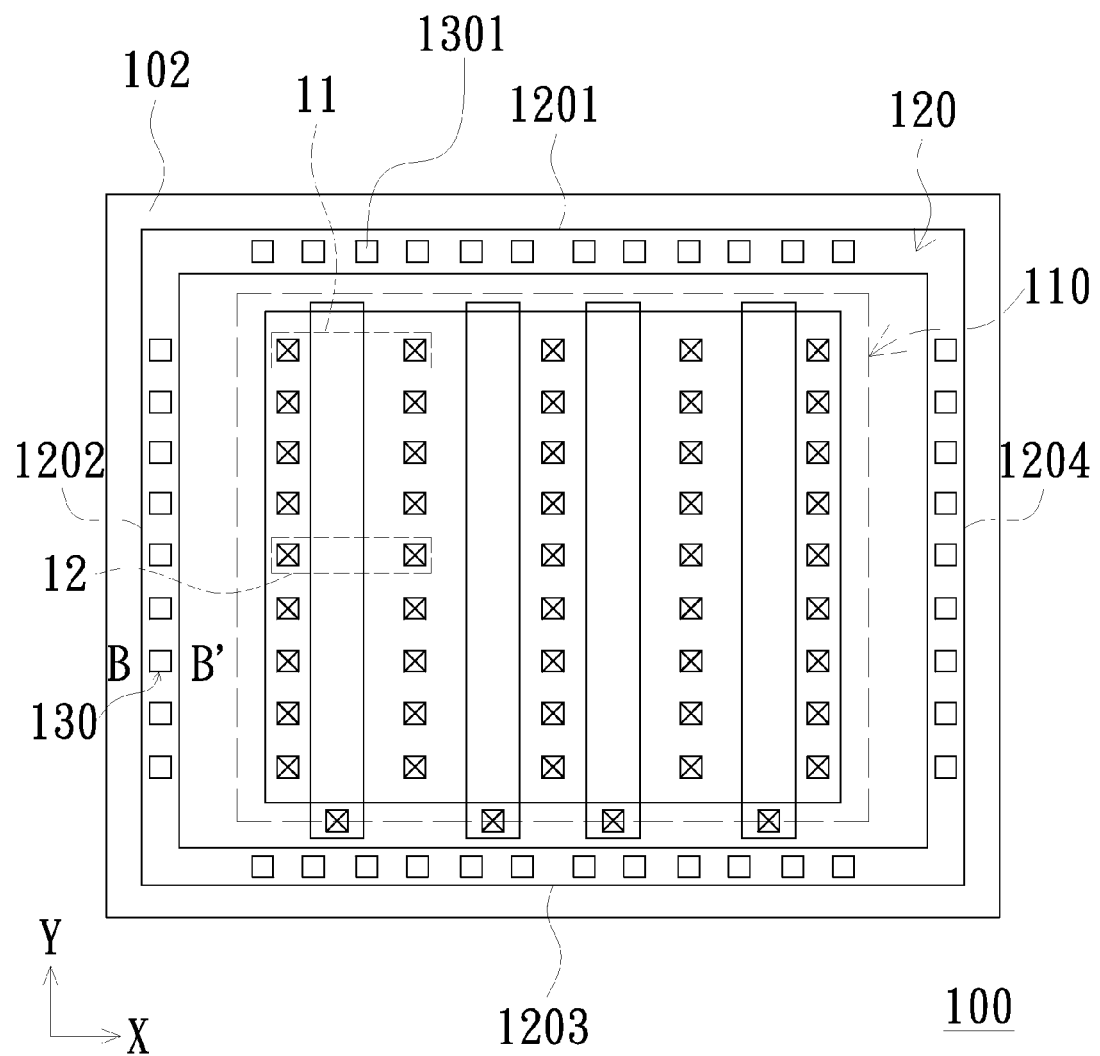
FIG. 1-4 schematically illustrates ESD protectors with different distributions of low resistance zones in accordance with different embodiments of the present invention.
Figure 14:
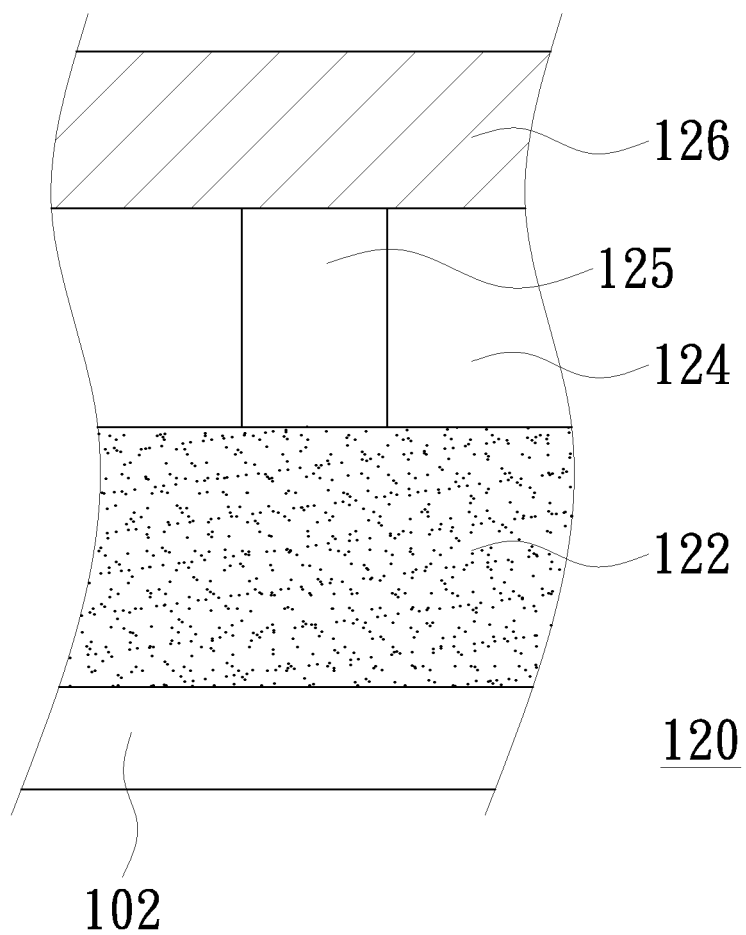
FIG. 14 is a cross sectional view taken along B-B' line shown in FIG. 1.

The present invention provides a plurality of structures of electrostatic discharge (ESD) protectors for better performance in electrostatic discharging. FIG. 1 schematically illustrates an ESD protector in accordance with an embodiment of the present invention. FIG. 14 is a cross sectional view taken along B-B' line shown in FIG. 1. As shown in FIG. 1 and FIG. 14, an ESD protector 100 has a substrate 102, an ESD protection circuit 110 disposed on the substrate 102 and a pickup ring 120. The pickup ring 120 may include a doping layer 122 implanted with impurity selected from the boron and nitrogen groups or other desirable elements/compounds, a plurality of contacts 125, and a metal layer 126. More specifically, the pickup ring 120 may include a plurality of low resistance zones 130 where the doping layer 122 with relatively high concentration in a range between about 1E20 atoms/cm$^3$ and 1E22 atoms/cm$^3$, the contacts 125 and the metal layer 126 are overlapped with each other. In each of the low resistance zones 130, the doping layer 122 with high concentration, the contact 125 and the metal layer 126 are stacked on the substrate 102 and connected in sequence and in electrically contact with one another; besides, the contacts 125 are formed in an interlayer 124 between the doping layer 122 and the metal layer 126 as shown in FIG. 14. The low resistance zones 130 are available for electric current passage.

As shown in FIG. 1, the pickup ring 120 may be a polygonal ring having several regions, for example, a first region 1201, a second region 1202 adjacent to the first region 1201, a third region 1203 opposite to the first region 1201, and a fourth region 1204 opposite to the second region 1202. The low resistance zones 130 are distributed within the pickup ring 120 separately, and distances between any adjacent low resistance zones 130 in the four regions, namely the first region 1201, the second region 1202, the third region 1203, and the fourth region 1204, are the same. The low resistance zones 130 in the first region 1201 are aligned with the low resistance zones 130 in the third region 1203; the low resistance zones 130 in the second region 1202 are aligned with the low resistance zones 130 in the fourth region 1204. In other words, the distribution of the low resistance zones 130 in the first region 1201 is the same as that in the third region 1203; and the distribution of the low resistance zones 130 in the second region 1202 is the same as that in the fourth region 1204.

The ESD protection circuit 110 may include a plurality of semiconductor elements, such as, metal-oxide semiconductors (MOSs), silicon controlled rectifiers (SCRs), bipolar junction transistors (BJTs), field effect transistors (FETs), or field oxide devices (FOXs). The substrate 102 can be doped by implantation process to form P type or N type diffusion well within a region covered by the ESD protection circuit 110 and the pickup ring 120.

In the case of the ESD protection circuit 110 having a plurality of MOSs disposed in sequence, as depicted in FIG. 1, a MOS 11 is one of the MOSs disposed at an edge of the ESD protection circuit 110 close to the first region 1201, a MOS 12 is another MOS disposed to be aligned with the MOS 11 and close to the center of the ESD protection circuit 110. And there can be a plurality of MOSs aligned with and between the (edge-located) MOS 11 (or hereinafter also referred to as the edge MOS 11) and the (center-located) MOS 12 (or hereinafter also referred to as the center MOS 12) in sequence.

However, the edge MOS 11 may be damaged by high temperature during a machine model (MM) level test but not the center MOS 12. The inventor has found that there are more electric charges accumulated/deposited on the edge MOS 11 than the center MOS 12 due to lower substrate resistance of the edge MOS 11 than that of the center MOS 12. The substrate resistances of the edge MOS 11 and the center MOS 12 can be corresponding to distances of each of them to the closest low resistance zone 130 on the pickup ring 120 as shown in FIG. 1 for easy illustration and better understanding. A distance between the edge MOS 11 and a closest low resistance zone 1301 along Y direction is smaller than a distance between the center MOS 12 and the closest low resistance zone 1301 along Y direction. In other words, the substrate resistance of the edge MOS 11 is smaller than the substrate resistance of the center MOS 12 along Y direction. And substrate resistances of the MOSs aligned with and placed between the edge MOS 11 and the center MOS 12 gradually increase from the side of the edge MOS 11 to the center MOS 12 along Y direction. Thus, the MOSs of the ESD protection circuit 110 are not turned on uniformly by ESD current in a direction from the edge MOS 11 to the center MOS 12 in the embodiment. The edge MOS 11 is turned on much faster than the center MOS 12. In addition, more electric charges accumulate/deposit on the edge MOS 11 than on the center MOS 12 during the MM test to cause and result in high temperature which makes the edge MOS 11 damaged.

Figure 2:
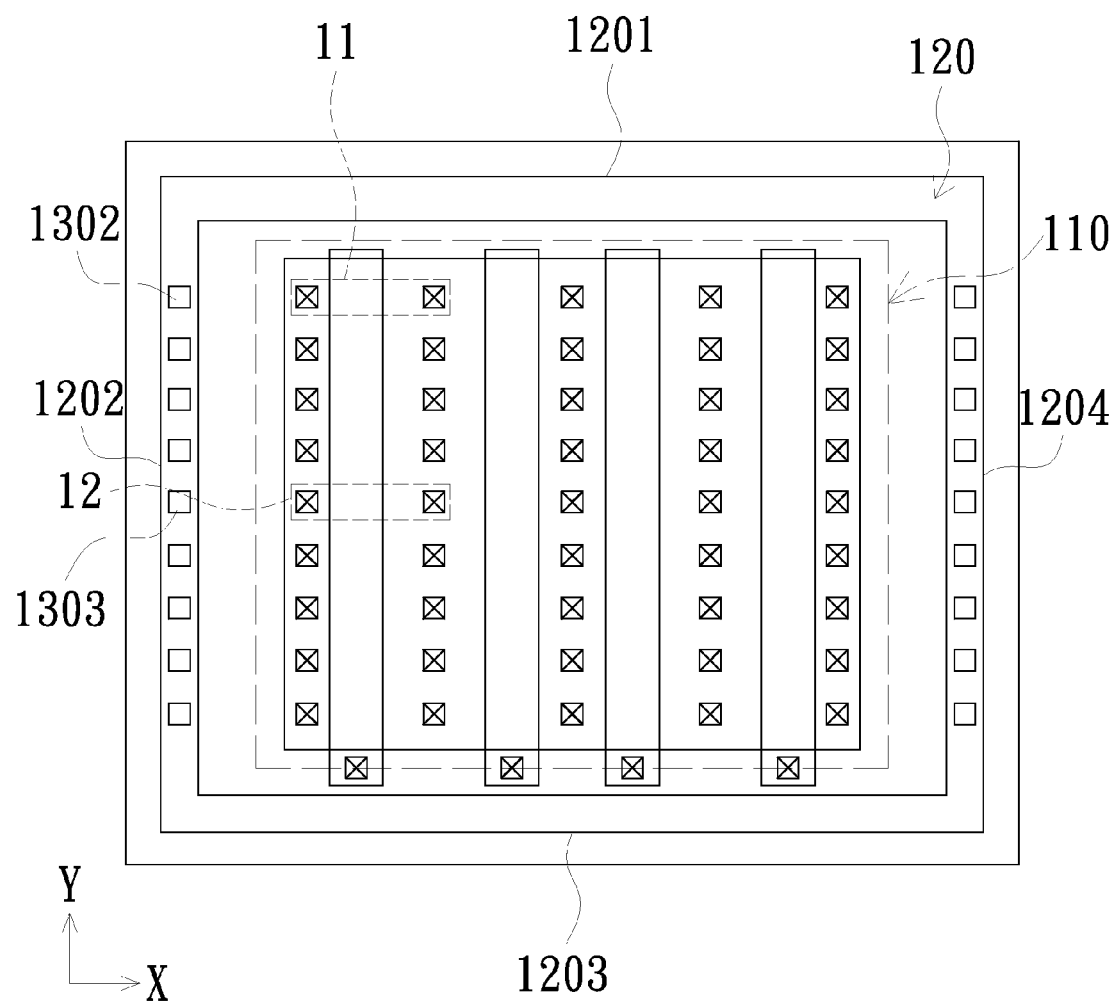

With reference to FIG. 2 depicted in accordance with another embodiment of the present invention with similar layout of the ESD protector 100 as shown in FIG. 1, the difference from the ESD protector 100 is that the low resistance zones 130 are distributed within the pickup ring 120 separately and unequally. For instance, a number of the low resistance zones 130 per unit area in the first region 1201 can be less than a number of the low resistance zones 130 per unit area in the second region 1202. In the case of the illustrated embodiment of FIG. 2 described above, the number of the low resistance zones 130 per unit area in the first region 1201 is zero while there are a plurality of the low resistance zones 130 in the second region 1202. In other words, the low resistance zones 130 in the first region 1201 are removed to avoid current passage to the edge MOS 11 and the center MOS 12 along Y direction. There is no low resistance zone 130 in the first region 1201 so that ESD current passes to the edge MOS 11 through a closest low resistance zones 1302 along X direction and the center MOS 12 through a closest low resistance zone 1303 along X direction on the pickup ring 120 respectively. A distance between the edge MOS 11 and the closest low resistance zone 1302 along X direction is substantially equal to a distance between the center MOS 12 and the closest low resistance zone 1303 along X direction. In other words, the substrate resistance of the edge MOS 11 is substantially equal to that of the center MOS 12. Furthermore, the substrate resistances of the MOSs placed between the edge MOS 11 and the center MOS 12 are also substantially equal to that of the edge MOS 11 and the center MOS 12. Consequently, the edge MOS 11 to the center MOS 12 in FIG. 2 can be uniformly turned on and improved on performances, and also damages from high temperatures to the edge MOS 11 can be prevented.

Similarly, the distribution of the low resistance zones 130 in the third region 1203 may be the same as the first region 1201, that is, a number of the low resistance zones 130 in the third region 1203 is also zero, as shown in FIG. 2. Hence, the MOSs of the ESD protection circuit 110 can be uniformly turned on, and damages from high temperatures to the edge MOS 11 can be avoided due to changes of distribution of the low resistance zones. Thus, the ESD protector shown in FIG. 2 can easily pass the MM level test. For example, in the positive MM level test, the ESD protector may bear or withstand a voltage of 350V; in the negative MM level test, the ESD protector may bear or withstand a voltage of −425V. It is to be noted that performances of the ESD protector with different semiconductor elements of the ESD protection circuit can also be enhanced likewise.

Figure 3:
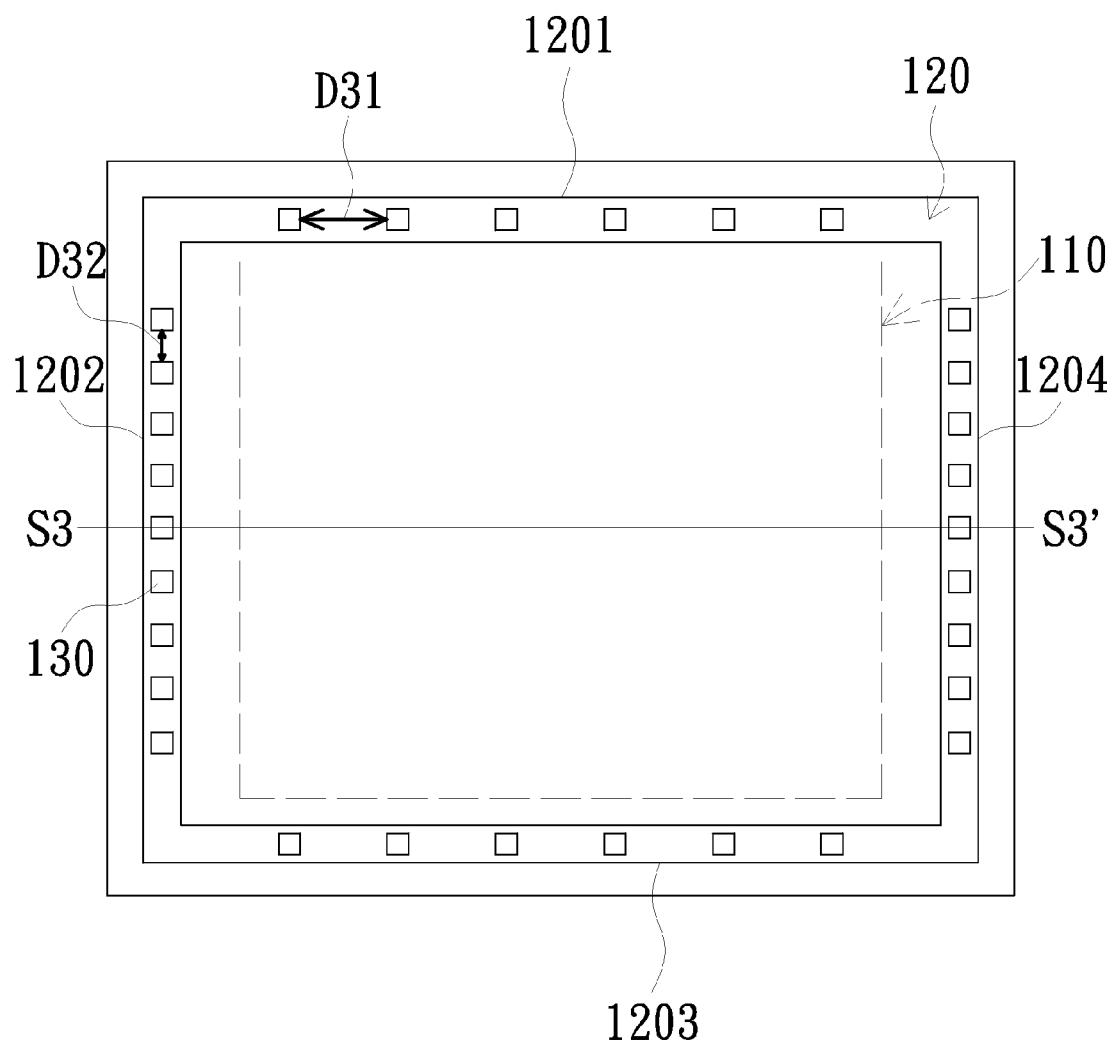

Distribution of the low resistance zones 130 within the pickup ring 120 can be adjusted practically or in actual practice based upon different needs, for example, as shown in FIG. 3 according to one embodiment of the present invention which is similar to the illustrated embodiment depicted in FIG. 2, distribution of the low resistance zones 130 can also be adjusted by a way of different distance intervals of the low resistance zones 130. More specifically, a distance D31 between any adjacent low resistance zones 130 in the first region 1201 is larger than a distance D32 between any adjacent low resistance zones 130 in the second region 1202. In other embodiments, the low resistance zones 130 in the first region 1201 may be distributed non-uniformly, e.g. different distance intervals of the low resistance zones 130 in the first region 1201.

Furthermore, in some embodiments, the two opposite regions can contain different or equal numbers of the low resistance zones 130 per unit area, and distribution of the low resistance zones 130 in the two opposite regions can also be different (asymmetrical) or aligned (symmetrical) according to different needs by following the above-discussed way to improve performances of the device. As shown in FIG. 3, distribution of the low resistance zones 130 in the third region 1203 is also the same as distribution of the low resistance zones 130 in the first region 1201, and the low resistance zones 130 in the third region 1203 are aligned (symmetrically arranged in relation to or with respect to S3-S3' axis) with those in the first region 1201 in the case of this illustrated embodiment.

In other embodiments, distribution of the low resistance zones 130 in the third region 1203 can be different from that in the first region 1201 (not shown). For examples, the third region 1203 can contain smaller or larger distance intervals of the low resistance zones 130 than the distance D31, equal number of low resistance zones 130 per unit area to the first region 1201 with different distance intervals of the low resistance zones 130 from the distance D31, equal number of the low resistance zones 130 per unit area to the first region 1201 with the same distance interval of the low resistance zones 130 as the distance D31 but the low resistance zones 130 in the third region 1203 are not aligned (asymmetrical) with those in the first region 1201, zero number of the low resistance zone 130 to be found in the third region 1203 while there is at least one low resistance zone 130 in the first region 1201, at least one low resistance zone 130 in the third region 1203 while there is no low resistance zone 130 in the first region 1201, and so on.

Figure 4:
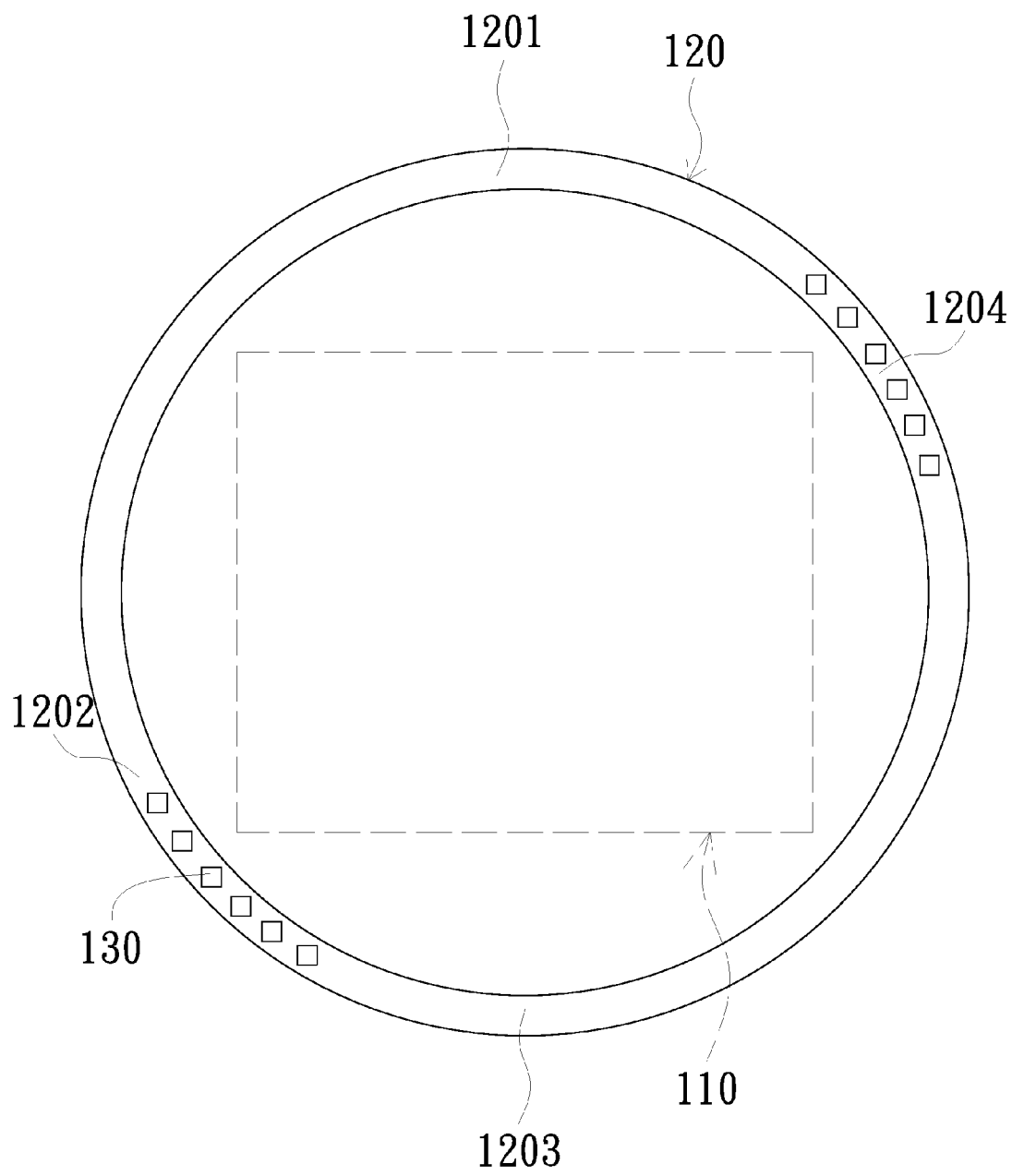

The pickup ring can also be a non-polygonal ring, such as a circle, ellipse or oval shape. As shown in FIG. 4 according to one embodiment of the present invention, the ESD protector of FIG. 4 may be similar to the ESD protector depicted in FIG. 2 and FIG. 3, the difference may be the pickup ring 120 is shaped and configured as being a non-polygonal ring (depicted as a circle just for the sake of illustration). The non-polygonal pickup ring 120 may also contain several regions, such as, the four regions 1201, 1202, 1203, 1204, surrounding the ESD protection circuit 110 and the low resistance zones 130 are distributed within the pickup ring 120 separately and unequally as mentioned above.

It is to be noted that, in some embodiments, a number of the low resistance zones 130 per unit area in the first region 1201 may be more than a number of the low resistance zones 130 per unit area in the second region 1202 in accordance with different layouts of the ESD protection circuit 110 (not shown). Besides, a distance interval of the low resistance zones 130 in the first region 1201 may be smaller than a distance interval of the low resistance zones 130 in the second region 1202 in accordance with different layouts of the ESD protection circuit 110 (not shown).

As described above, in each of the low resistance zones 130, the doping layer 122 with high concentration, the contact 125 and the metal layer 126 are stacked on the substrate 102 in sequence and in electrically contact with one another. Distribution of the low resistance zones 130 within the pickup ring 120 is adjusted to make substrate resistance of each of the semiconductor elements (e.g. MOSs) within the ESD protection circuit substantially equal. By means of making substrate resistance of each of the semiconductor elements substantially equal, distribution of the contacts 125, the doping layer 122 with high concentration, and the metal layer 126 can be adjusted individually or in combination to have desired consequences and device performances.

The following descriptions are for discussion of distribution of the contacts 125, the doping layer 122 with high concentration, and the metal layer 126 individually with the other two disposed equally and uniformly within the pickup ring 120.

First, distributions of the contacts 125 are illustrated individually with the metal layer 126 and the doping layer 122 are distributed equally and uniformly within the entire area of the pickup ring 120.

Figure 5:
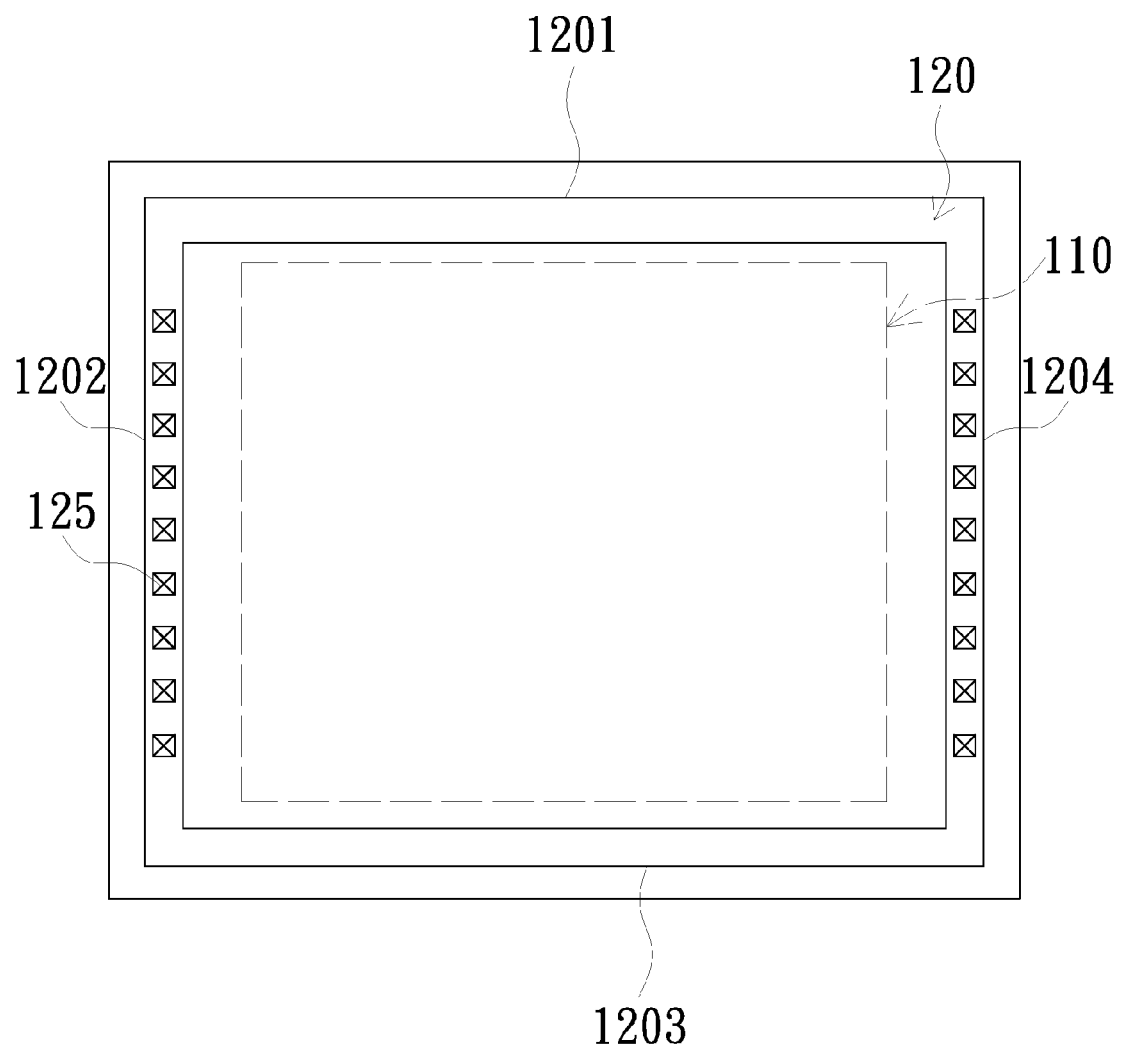
FIG. 5-7 schematically illustrates ESD protectors with different distributions of contacts in accordance with different embodiments of the present invention.
Figure 6:
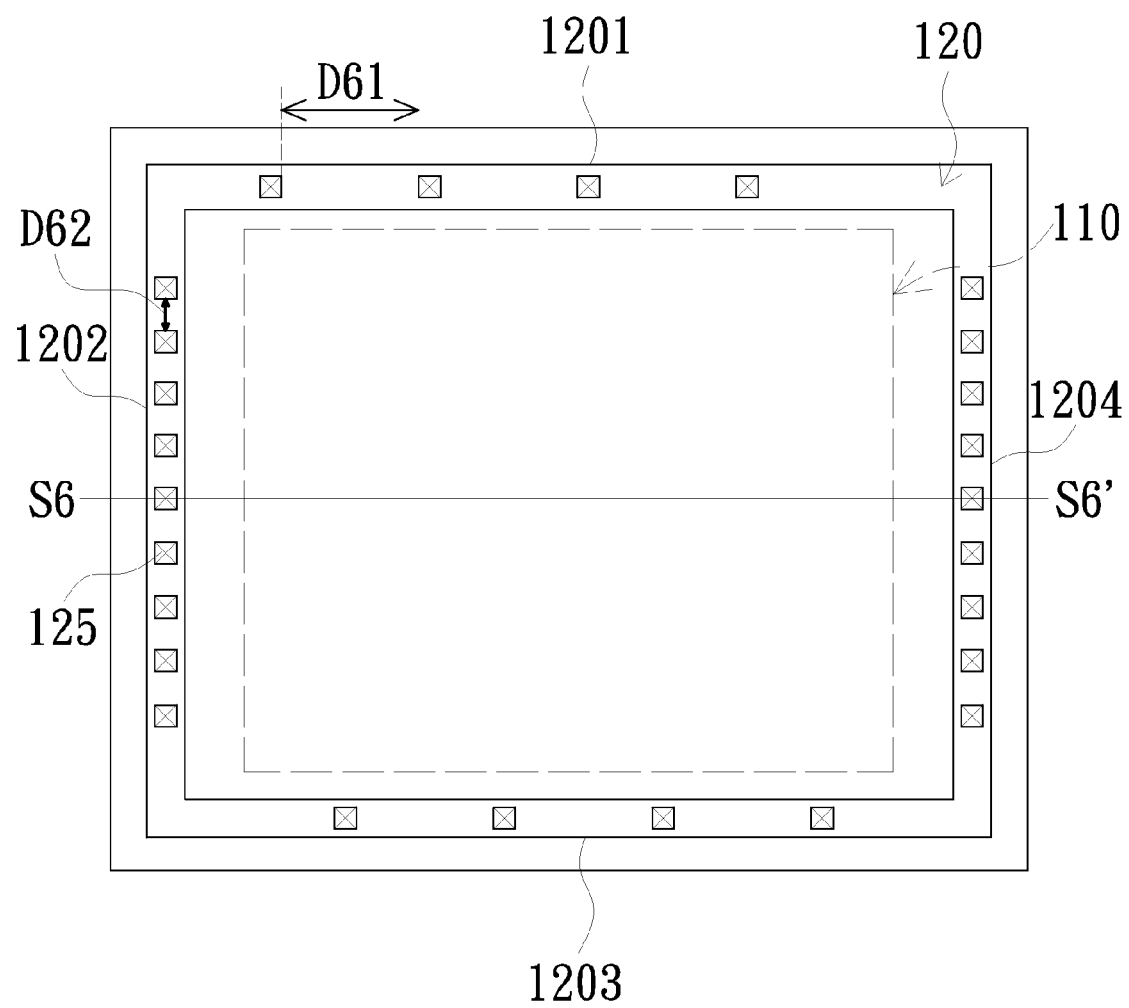

As shown in FIGS. 5 and 6 according to two embodiments of the present invention, the pickup ring 120 is a polygonal ring having a first region 1201, a second region 1202 adjacent to the first region 1201, a third region 1203 opposite to the first region 1201, and a fourth region 1204 opposite to the second region 1202. The pickup ring 120 contains a plurality of the contacts 125 distributed separately and unequally to adjust substrate resistances of each of the semiconductor elements of the ESD protection circuit 110 substantially equal. Each of the four regions 1201, 1202, 1203, and 1204 can contain different numbers of the contacts 125 per unit area. The two opposite regions can contain different or equal numbers of the contacts 125 per unit area, and distribution of the contacts 125 in the two opposite regions can also be different (asymmetrical) or aligned (symmetrical) according to different needs by following the above-discussed way to improve performances of the device.

A number of the contacts 125 per unit area in the first region 1201 can be less than a number of the contacts 125 per unit area in the second region 1202, as shown in FIG. 5 and FIG. 6. More specifically, in the case of the illustrated embodiment shown in FIG. 5, the number of the contacts 125 per unit area in the first region 1201 is zero, while there is at least one contact 125 in the second region 1202.

With regard to FIG. 6, distribution of the contacts 125 can also be adjusted by a way of different distance intervals of the contacts 125. A distance D61 between any adjacent contacts 125 in the first region 1201 is larger than a distance D62 between any adjacent contacts 125 in the second region 1202.

Distribution of the contacts 125 in the third region 1203 can be same/aligned (symmetrical) with or different (asymmetrical) from the first region 1201. As shown in FIG. 5, the distribution of the contacts 125 in the third region 1203 is the same as that in the first region 1201; that is, a number of the contacts 125 in the third region 1203 is also zero. As shown in FIG. 6, distribution of the contacts 125 in the third region 1203 is different (interlacedly/staggeredly aligned or asymmetrically arranged along with respect to S6-S6' axis) from that in the first region 1201 with a same number of the contacts 125 per unit area and the same distance interval of the contacts 125 as the distance D61 but not aligned with the contacts located in the first region 1201.

In other embodiments, the distribution of the contacts 125 in the third region 1203 can be different (asymmetrical) from that in the first region 1201. For examples, the third region 1203 can contain smaller or larger distance intervals of the contacts 125 than the distance D61 with equal or different number of the contacts 125 per unit area from that in the first region 1201, zero number of the low resistance zone 130 in the third region 1203 while there is at least one low resistance zone 130 in the first region 1201, at least one low resistance zone 130 in the third region 1203 while there is no low resistance zone 130 in the first region 1201, and so on.

Figure 7:
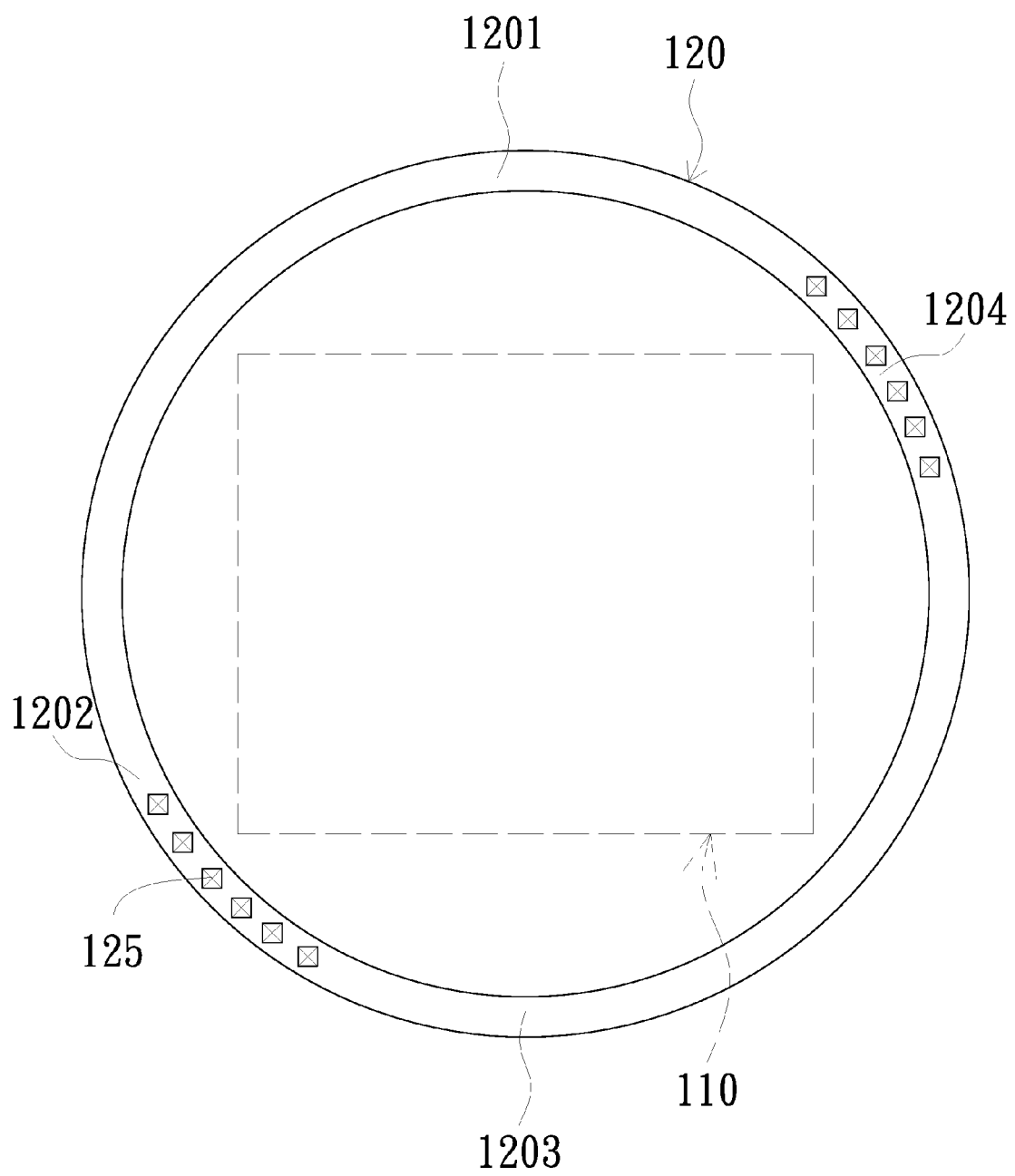

The pickup ring 120 can also be a non-polygonal ring, such as a circle, ellipse or oval shape. As shown in FIG. 7 according to an embodiment of the present invention, the ESD protector of FIG. 7 may be similar to the ESD protector depicted in FIG. 5 and FIG. 6, the difference may be the pickup ring 120 is a non-polygonal ring (depicted as a circle just for the sake of illustration). The non-polygonal pickup ring 120 may also contain several regions, such as four regions 1201, 1202, 1203, 1204, surrounding the ESD protection circuit 110 and the contacts 125 are distributed within the pickup ring 120 separately and unequally as mentioned above.

It should be noted that layouts of the ESD protection circuit 110 can be different, and distribution of the contacts can be adjusted with respect to the different layouts by following the way and generic rules described above.

As described above, distribution of the low resistance zones 130 within the pickup ring 120 can be adjusted by different distribution of the contacts 125, the doping layer 122 with high concentration, and the metal layer 126 singularly or in combination. So next, distributions of the doping layer 122 with high concentration are illustrated, while the contacts 125 are distributed equally and uniformly within the pickup ring 120 and the metal layer 126 is distributed equally and uniformly within the entire area of the pickup ring 120.

Figure 8:
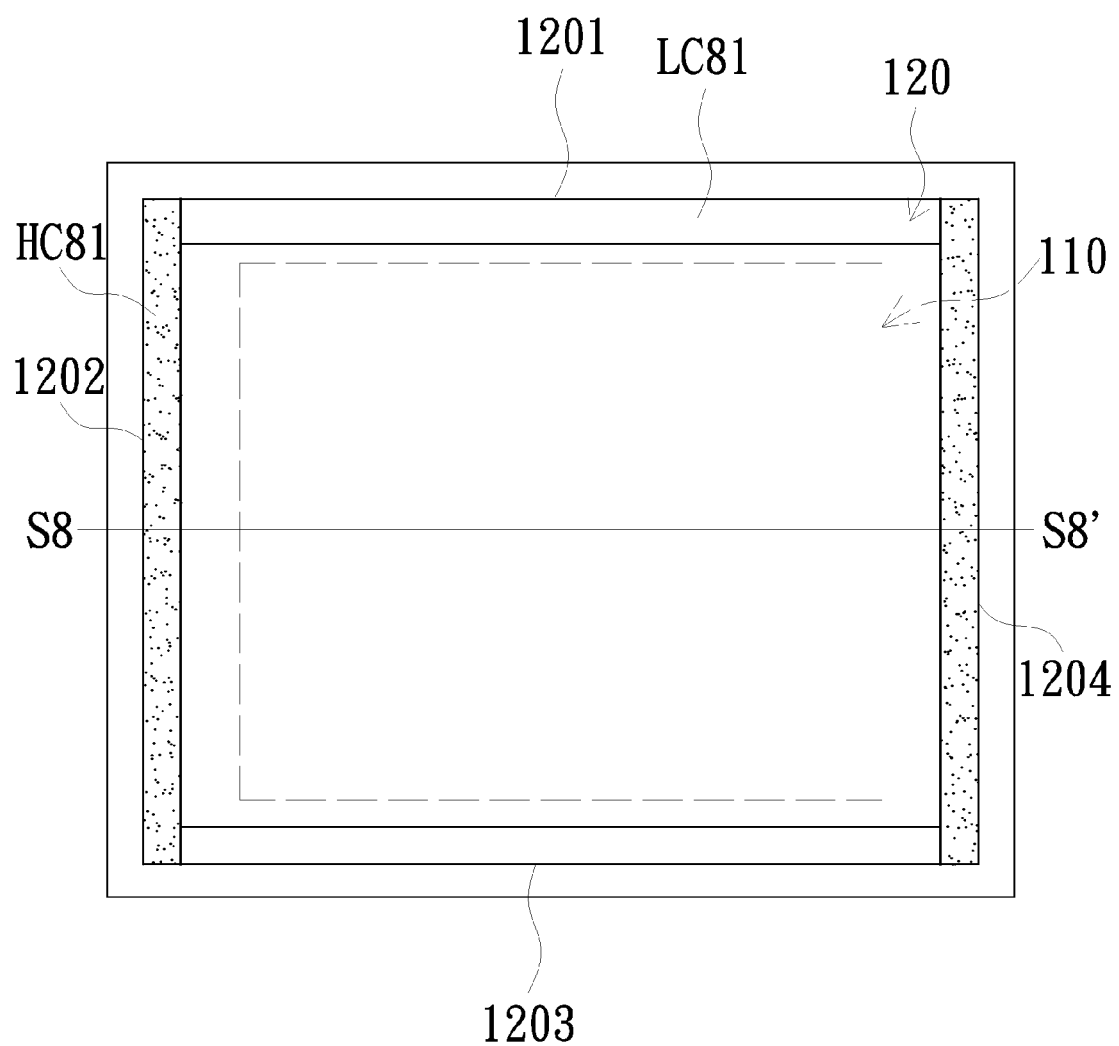
FIG. 8-10 schematically illustrates ESD protectors with different concentration distributions of doping layer in accordance with different embodiments of the present invention.
Figure 9:
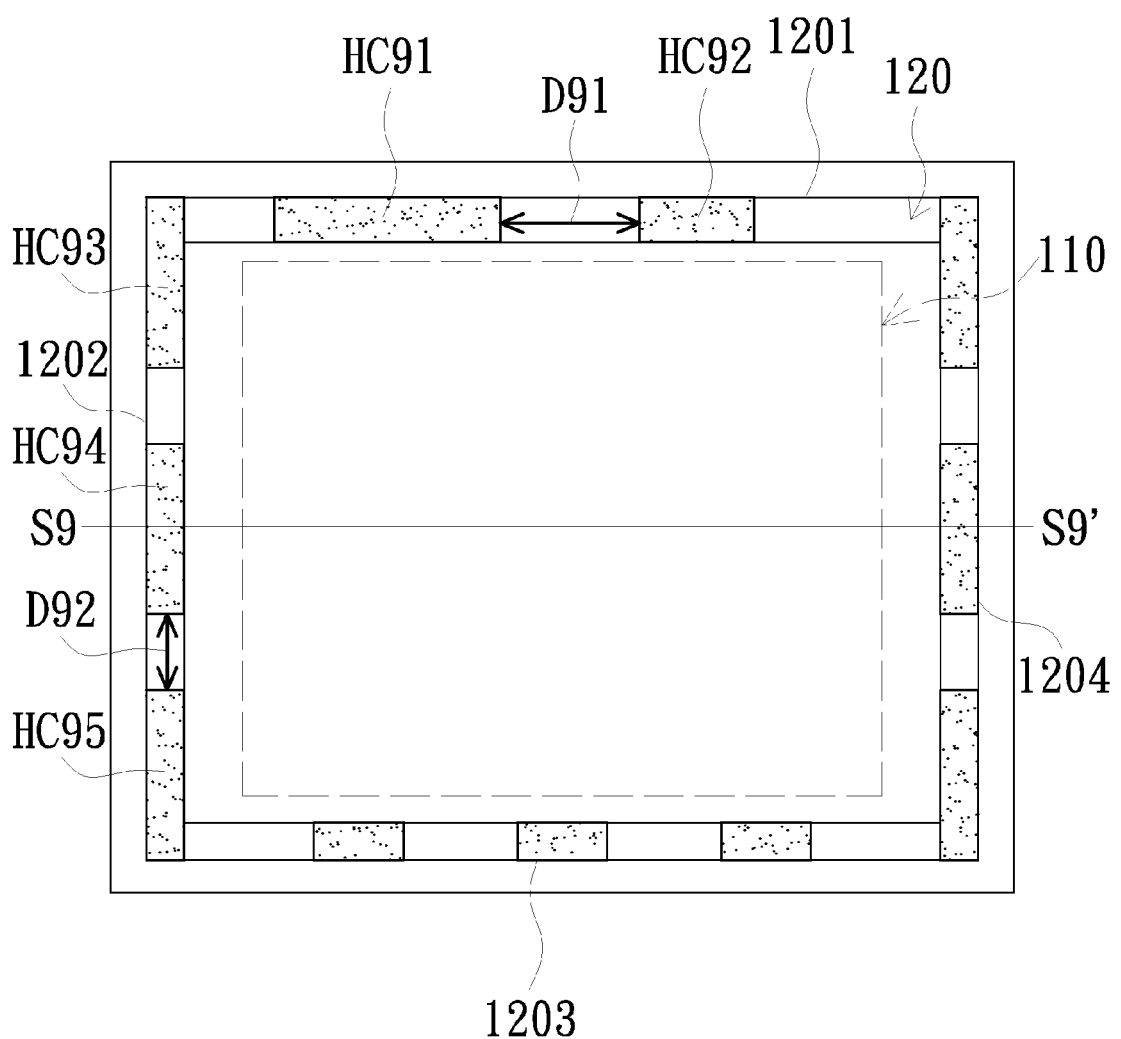

The doping layer 122 can have different doping concentrations within the pickup ring 120 to adjust substrate resistances of each of the semiconductor elements in the ESD protection circuit 110 substantially equal. As shown in FIGS. 8 and 9, according to two illustrated embodiments of the present invention, the pickup ring 120 is a polygonal ring having a first region 1201, a second region 1202 adjacent to the first region 1201, a third region 1203 opposite to the first region 1201, and a fourth region 1204 opposite to the second region 1202. Each of the four regions 1201, 1202, 1203, and 1204 can have different concentrations of the doping layer 122, or different concentration distributions of the doping layer 122. Concentration distributions of the doping layer 122 in the two opposite regions (i.e. regions 1201 and 1203) can also be different (asymmetrical) or aligned (symmetrical) according to different needs by following the above-discussed method to improve performances of the device.

The doping layer 122 can include a plurality of doping regions, and the doping regions can have different area sizes and different concentrations. A doping region having a doping concentration in a range between 1E20 and 1E22 atoms/cm$^3$ is considered as a high concentration doping region, which can allow current passage while electrically contact with the contact 125 and the metal layer 126. A doping region having a doping concentration below 1E20 atoms/cm$^3$, which makes the region of the doping layer having an excessively high resistance value to allow current passage while electrically contacting with the contact 125 and the metal layer 126, are considered as a low concentration doping region.

To make the substrate resistances of the semiconductor elements substantially equal, distributions of the high and low concentration doping regions are adjusted in different way.

A concentration of the doping layer 122 in the first region 1201 can be lower than a concentration of the doping layer 122 in the second region 1202. As shown in FIG. 8, a low concentration doping region LC81 of the doping layer 122 is disposed in an entirety of the first region 1201, and a high concentration doping region HC81 of the doping layer 122 is disposed in an entirety of the second region 1202. In one embodiment, a low concentration doping region is disposed in an entirety of the first region 1201 with a concentration substantially equal to zero, or no doping layer technically in the first region 1201, and the high concentration doping region is disposed in an entirety of the second region 1202.

With regard to FIG. 9, distributions of the high and low concentration doping regions can also be adjusted by a way of different distance intervals of the high concentration doping regions, and/or sizes of the high concentration doping regions within the pickup ring 120 can be non-uniform. For example, a distance D91 between any adjacent high concentration doping regions in the first region 1201 is larger than a distance D92 between any adjacent high concentration doping regions in the second region 1202. Sizes of the high concentration doping region HC91 is larger than the high concentration doping region HC92 in the first region 1201, and sizes of the high concentration doping regions HC93-HC95 in the second region 1202 are uniform.

Concentration distribution of the doping layer 122 in the third region 1203 can be same (symmetrical) to or different (asymmetrical) from that in the first region 1201. As shown in FIG. 8, the concentration distribution of the doping layer 122 in the third region 1203 is the same (symmetrical on S8-S8' axis) as the first region 1201, that is, concentration of the doping layer 122 in the third region 1203 is also substantially equal to zero, or no doping layer 122 technically is found, in this case. As shown in FIG. 9, the concentration distribution of the doping layer 122 in the third region 1203 is different (asymmetrical on S9-S9' axis) from concentration distribution of the doping layer 122 in the first region 1201. In other embodiments, the concentration distribution of the doping layer 122 in the third region 1203 can be the same (symmetrical) as that in the first region 1201 while there are a plurality of the high concentration doping regions in the first region 1201 (not shown).

Figure 10:
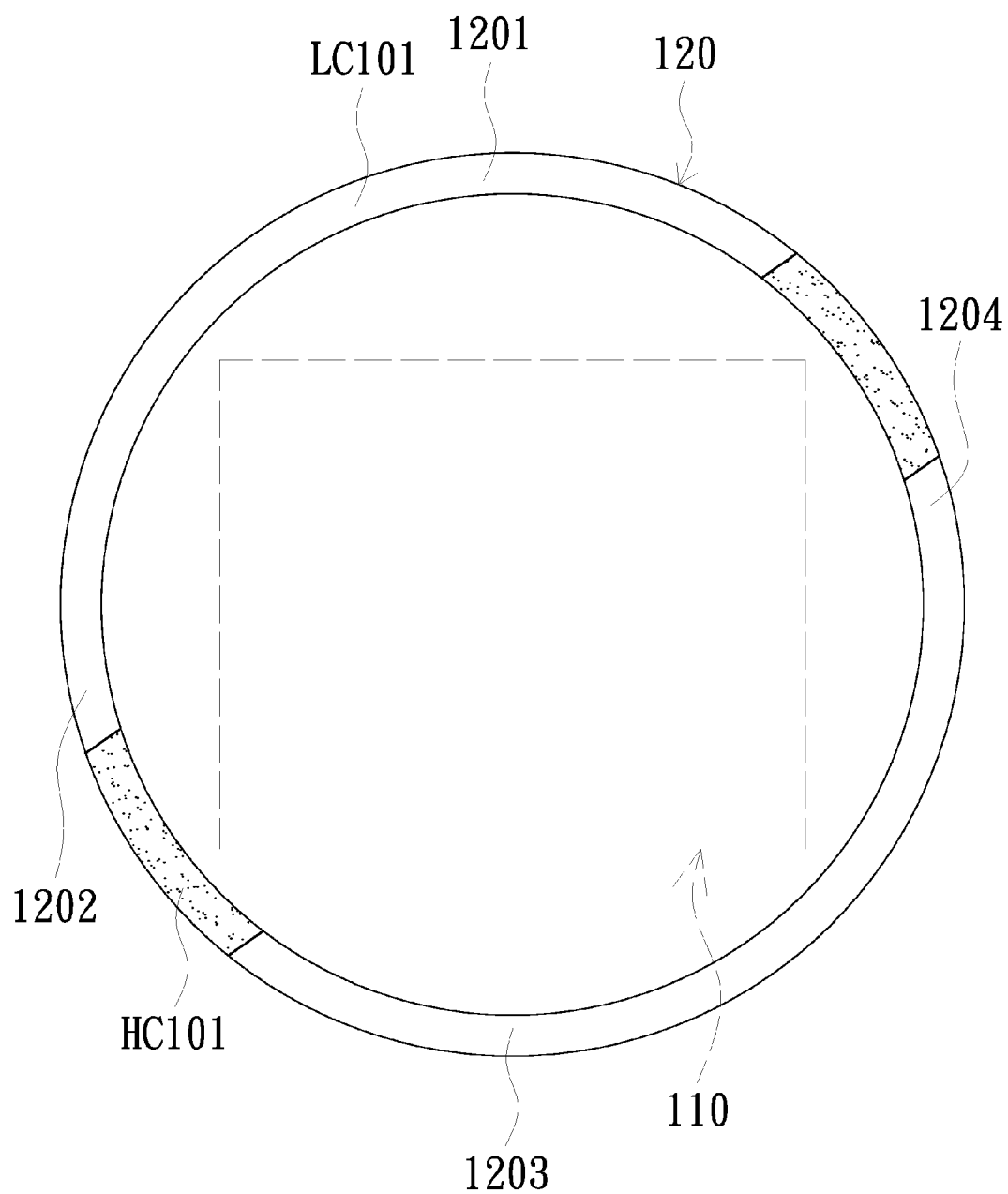

The pickup ring 120 also can be a non-polygonal ring, such a circle, ellipse or oval shape. As shown in FIG. 10 according to an embodiment of the present invention, the ESD protector of FIG. 10 may be similar to the ESD protector depicted in FIG. 8 and FIG. 9, the difference may be the pickup ring 120 is a non-polygonal ring (depicted as a circle just for the sake of illustration). The non-polygonal pickup ring 120 may also contain several regions, such as four regions 1201, 1202, 1203, 1204, surrounding the ESD protection circuit 110 and the different concentration regions of the doping layer 122 are distributed within the pickup ring 120 separately and unequally as mentioned above. For example as shown in FIG. 10, a low concentration doping region LC101 is disposed in the first region 1201 and/or the third region 1203, and a high concentration doping region HC101 is disposed within the second region 1202 and/or the fourth region 1204.

Moreover, distributions of the metal layer 126 are illustrated while the contacts 125 and the doping layer 122 are distributed equally within the pickup ring 120.

The metal layer 126 can include a plurality of metal blocks, and the metal blocks can have different area sizes disposed within the pickup ring 120.

Figure 11:
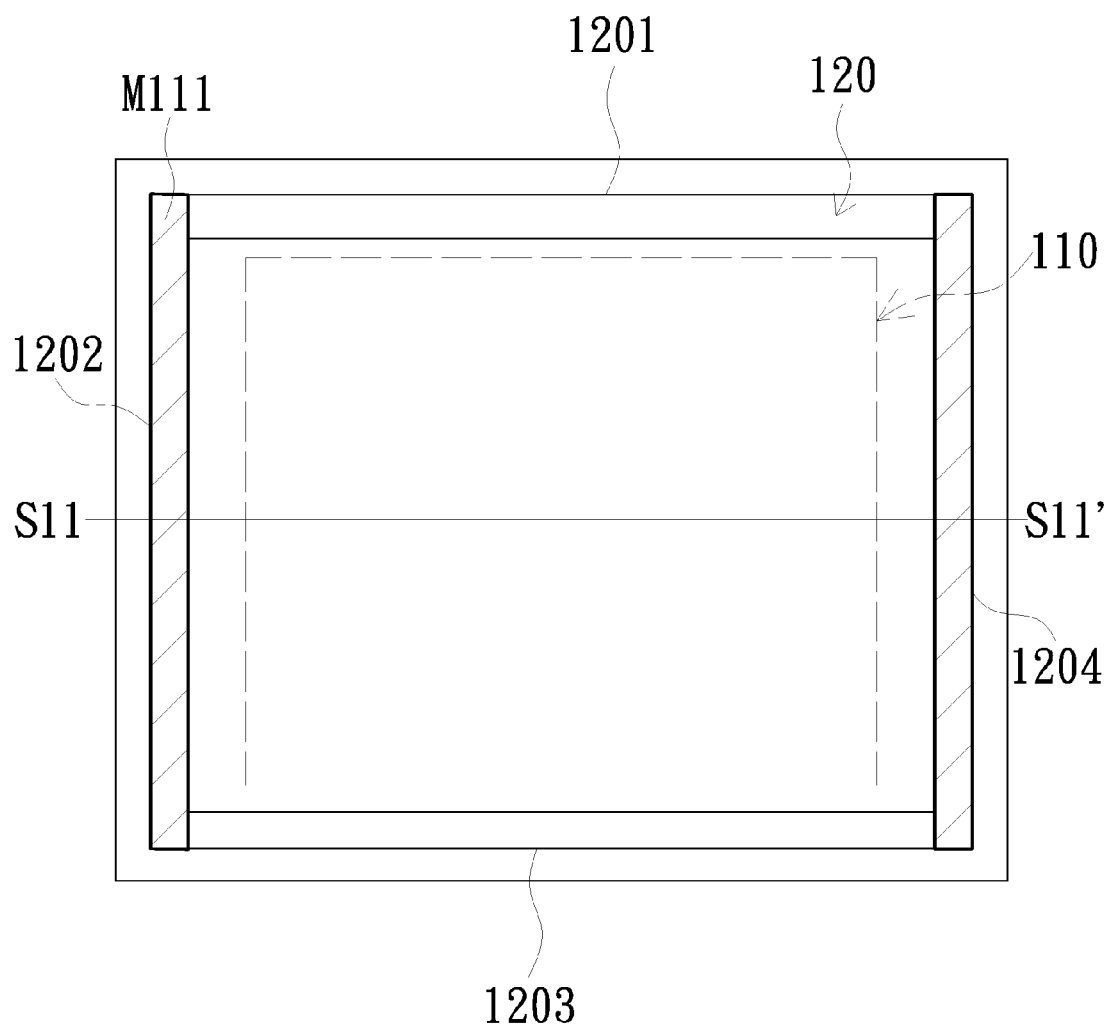
FIG. 11-13 schematically illustrates ESD protectors with different distributions of metal blocks in accordance with different embodiments of the present invention.
Figure 12:
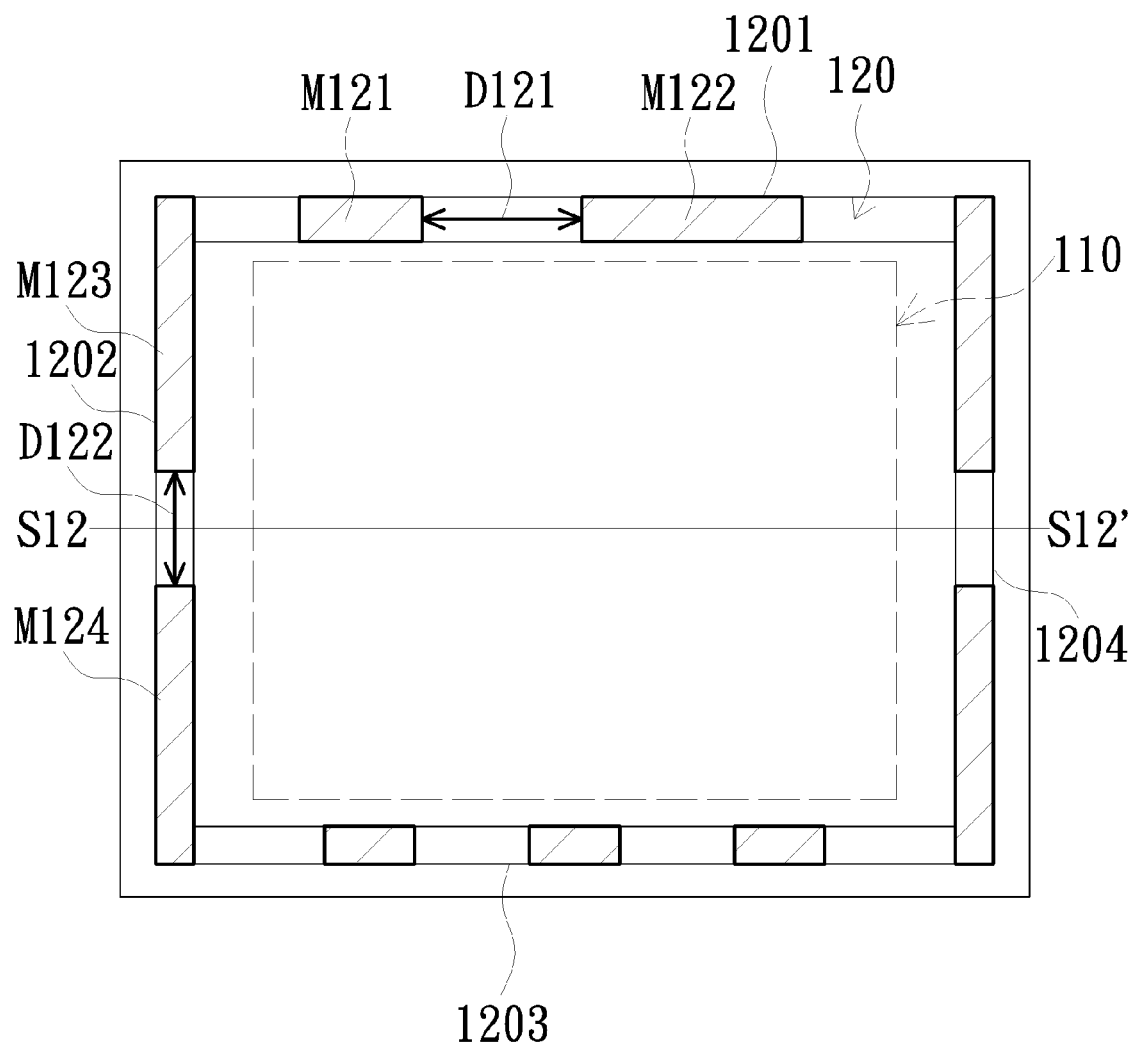

The metal layer 126 can have different distributions within the pickup ring 120 to adjust substrate resistances of the semiconductor elements substantially equal. As shown in FIGS. 11 and 12 according to two embodiments of the present invention, the pickup ring 120 is a polygonal ring having a first region 1201, a second region 1202 adjacent to the first region 1201, a third region 1203 opposite to the first region 1201, and a fourth region 1204 opposite to the second region 1202. Each of the four regions 1201, 1202, 1203, and 1204 can have different distributions of metal blocks. Distributions of the metal blocks in the two opposite regions can also be different (asymmetrical) or aligned (symmetrical) according to different needs by following the above-discussed method to improve performances of the device.

A number of the metal blocks in the first region can be less than a number of the metal blocks in the second region. As shown in FIG. 11, there is no metal block disposed in the first region 1201, and one metal block M111 is disposed in an entirety of the second region 1202. In other embodiments, there can be at least one metal block in the first region 1201 and a plurality of the metal blocks in the second region 1202 (not shown). It should be noted here that sizes of metal blocks can be varied.

With regard to FIG. 12, distribution of the metal blocks can also be adjusted by a way of different distance intervals, and/or the metal blocks within the pickup ring 120 can have different area sizes. A distance D121 between any adjacent metal blocks in the first region 1201 is larger than a distance D122 between any adjacent contacts 125 in the second region 1202. In the illustrated embodiment shown in FIG. 12, a distance D121 in the first region 1201 is greater than a distance D122 in the second region 1202. A size of a metal block M121 is larger than that of a metal block M122 in the first region 1201, and sizes of a plurality of metal blocks M123 and M124 in the second region 1202 are uniform.

Distribution of the metal blocks in the third region 1203 can be same (symmetrical) to or different (asymmetrical) from the first region 1201. As shown in FIG. 11, the distribution of the metal blocks in the third region 1203 is the same (symmetrical on S11-S11' axis) as that in the first region 1201; that is, there is no metal layer 126 in the third region 1203 in this case. As shown in FIG. 12, the distribution of the metal blocks in the third region 1203 is different (asymmetrical on S12-S12' axis) from the that in the first region 1201. In other embodiments, distribution of the metal blocks in the third region 1203 can be same (symmetrical) with that in the first region 1201 while there are a plurality of the metal blocks disposed separately and unequally in the first and third regions 1201 and 1203.

Figure 13:
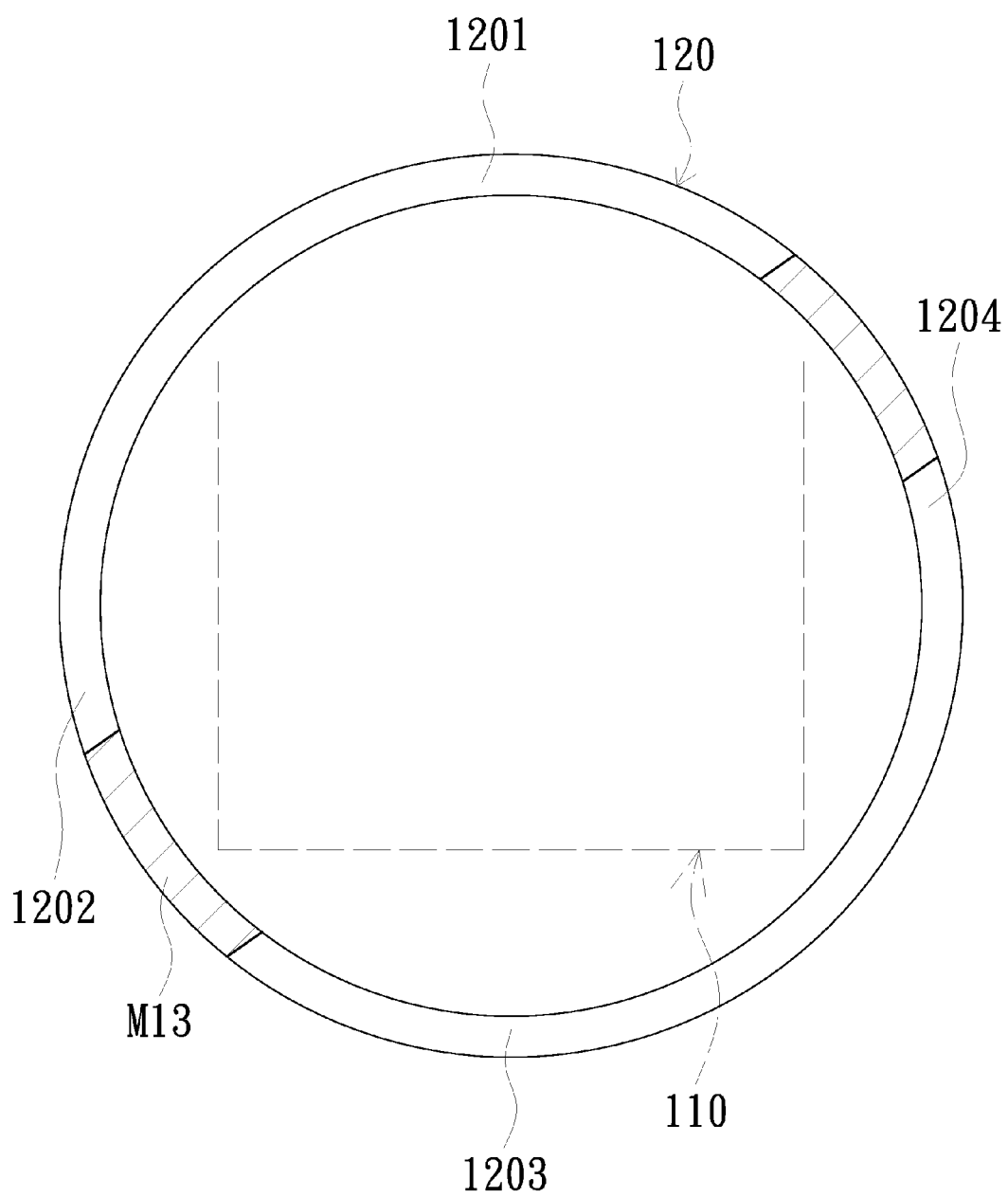

The pickup ring 120 also can be a non-polygonal ring, such as a circle, ellipse or oval shape. As shown in FIG. 13 according to an embodiment of the present invention, the ESD protector of FIG. 13 may be similar to the ESD protector depicted in FIG. 11 and FIG. 12, the difference may be the pickup ring 120 is a non-polygonal ring (depicted as a circle just for the sake of illustration). The non-polygonal pickup ring 120 may also contain several regions, such as four regions 1201, 1202, 1203, 1204, surrounding the ESD protection circuit 110 and there are a plurality of metal blocks M13 disposed only over a part of the doping layer 122. For example, the metal blocks M13 are disposed only in the second region 1202 and/or the forth region 1204.

In accordance with the aforementioned embodiments of the present invention, different structures of pickup rings of ESD protectors are provided for improvement of device performance. As described in details above, different embodiments to different distributions of each layer can be used in singular or in combination to reach desired performance of devices.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An electrostatic discharge protector comprising:
   a substrate;
   an electrostatic discharge protection circuit disposed on said substrate; and
   a pickup ring surrounding said electrostatic discharge protection circuit, wherein said pickup ring has a first region and an adjacent second region and comprises a plurality of contacts and a doping layer disposed under and directly contacted with said plurality of contacts, said doping layer has different doping concentrations therein to form a plurality of doping regions alternately arranged within said pickup ring and said different contacts of said plurality of contacts respectively contact with different doping regions portions having different doping concentrations of said doping layer.

2. The electrostatic discharge protector according to claim 1, wherein a first distance between two of adjacent said contacts in said first region is equal to a second distance between two of adjacent said contacts in said second region, and a concentration of a part of said doping layer in said first region is lower than a concentration of a part of said doping layer in said second region.

3. An electrostatic discharge protector comprising:
a substrate;
an electrostatic discharge protection circuit disposed on said substrate;
a doping layer disposed on said substrate and surrounding said electrostatic discharge protection circuit, said doping layer having a first region and a second region;
a metal layer only disposed over a part of said doping layer, wherein said metal layer comprises a plurality of metal blocks with different area sizes distributed separately and equally; and
a plurality of contacts disposed between said doping layer and said metal layer.

4. The electrostatic discharge protector according to claim 1, wherein there is no said doping layer disposed within said first region.

5. The electrostatic discharge protector according to claim 1, wherein said doping layer comprises high concentration doping regions and low concentration doping regions, said high concentration doping regions are separated by said low concentration doping regions, said low concentration doping region are separated by said high concentration doping regions, and different contacts of said plurality of contacts contact respectively with said high concentration doping regions and said low concentration doping regions.

6. The electrostatic discharge protector according to claim 3, wherein a first distance between two of adjacent said metal blocks over said first region of said doping layer is larger than a second distance between two of adjacent said metal blocks over said second region of said doping layer.

7. The electrostatic discharge protector according to claim 3, wherein at least one of said plurality of metal blocks contacts with two or more of said plurality of contacts.

* * * * *